(12) United States Patent
Ramm et al.

(10) Patent No.: US 7,939,181 B2
(45) Date of Patent: May 10, 2011

(54) LAYER SYSTEM WITH AT LEAST ONE MIXED CRYSTAL LAYER OF A MULTI-OXIDE

(75) Inventors: Jürgen Ramm, Maienfeld (CH); Beno Widrig, Bad Ragaz (CH); Michael Ante, Rankweil (AT); Christian Wohlrab, Feldkirch (AT)

(73) Assignee: Oerlikon Trading AG, Trubbach, Trubbach (CH)

( * ) Notice: Subject to any disclaimer, the term of this patent is extended or adjusted under 35 U.S.C. 154(b) by 697 days.

(21) Appl. No.: 11/548,529

(22) Filed: Oct. 11, 2006

(65) Prior Publication Data

US 2008/0090099 A1 Apr. 17, 2008

(51) Int. Cl.
*B32B 18/00* (2006.01)
*B32B 15/04* (2006.01)

(52) U.S. Cl. ........ 428/640; 428/632; 428/633; 428/635; 428/701

(58) Field of Classification Search .......................... None
See application file for complete search history.

(56) References Cited

U.S. PATENT DOCUMENTS

| 5,310,607 | A | 5/1994 | Schulz |
| 6,767,627 | B2 | 7/2004 | Morikawa et al. |
| 2004/0121147 | A1 | 6/2004 | Morikawa |
| 2006/0263640 | A1 | 11/2006 | Tamagaki |
| 2007/0000772 | A1 | 1/2007 | Ramm |

FOREIGN PATENT DOCUMENTS

| DE | 19522331 A1 | 1/1996 |
| EP | 0513662 A1 | 11/1992 |
| EP | 0744473 B1 | 10/2006 |
| JP | 2002-53946 A | 2/2002 |
| WO | 2004/097062 A1 | 3/2004 |
| WO | 2004/097062 A | 11/2004 |
| WO | 2006/099758 A2 | 9/2006 |

OTHER PUBLICATIONS

International Search Report dated Feb. 26, 2007.

*Primary Examiner* — Aaron Austin
(74) *Attorney, Agent, or Firm* — Pearne & Gordon LLP

(57) ABSTRACT

A PVD layer system for the coating of workpieces encompasses at least one mixed-crystal layer of a multi-oxide having the following composition: $(Me1_{1-x}Me2_x)_2O_3$, where Me1 and Me2 each represent at least one of the elements Al, Cr, Fe, Li, Mg, Mn, Nb, Ti, Sb or V. The elements of Me1 and Me2 differ from one another. The crystal lattice of the mixed-crystal layer in the PVD layer system has a corundum structure which in an x-ray diffractometrically analyzed spectrum of the mixed-crystal layer is characterized by at least three of the lines associated with the corundum structure. Also disclosed is a vacuum coating method for producing a mixed-crystal layer of a multi-oxide, as well as correspondingly coated tools and components.

46 Claims, 6 Drawing Sheets

Cr content

Temperature

LAYER SYSTEM WITH AT LEAST ONE MIXED CRYSTAL LAYER OF A MULTI-OXIDE

Figure 1A:
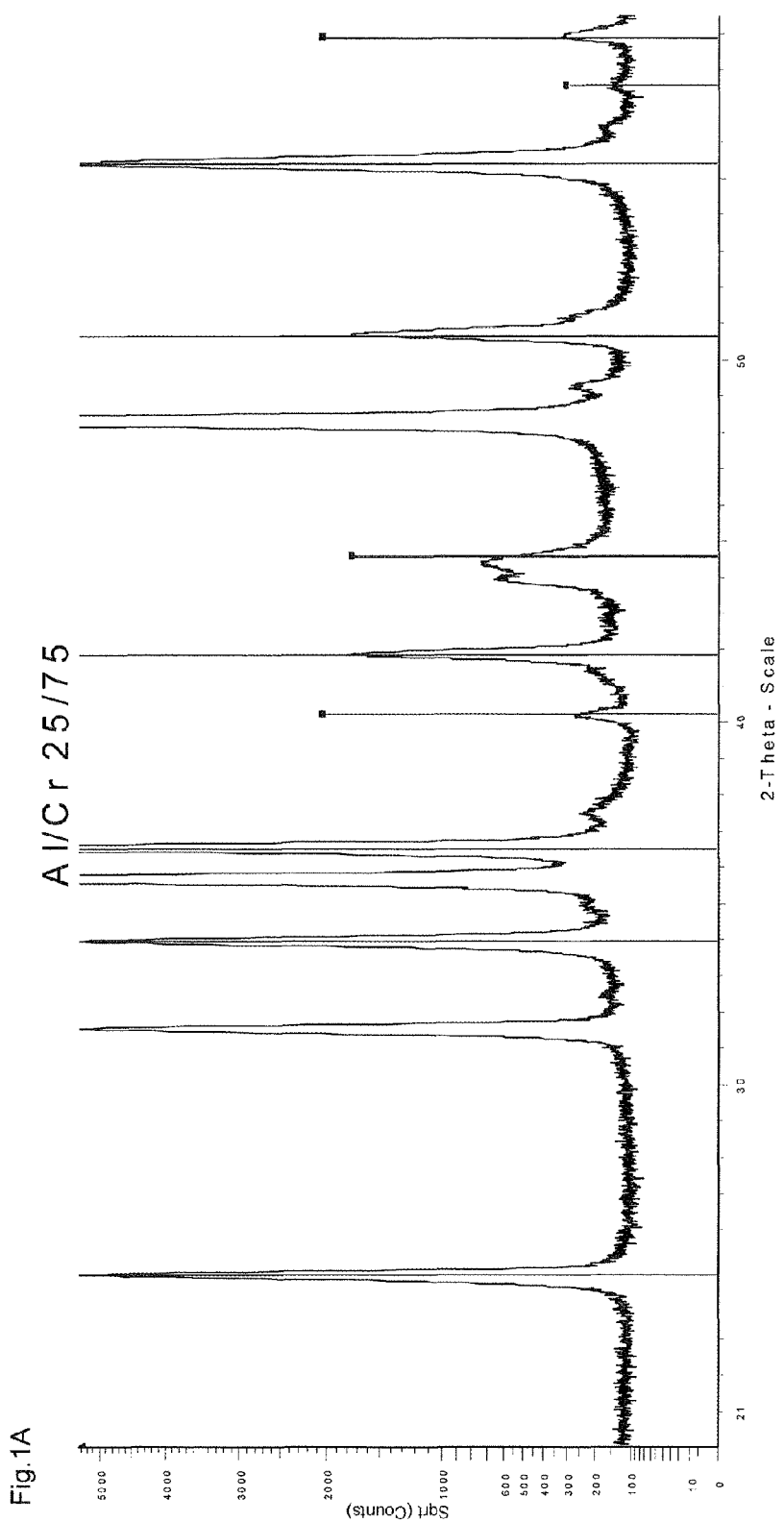

This invention relates to a PVD layer system for the coating of workpieces, as specified in the characterizing clause of claim 1, and to a method for fabricating a corresponding coating system as specified in the characterizing clauses of claims 21 and 26. The invention further relates to workpieces coated with a layer system according to the invention and having the characterizing features specified in claim 42.

PRIOR ART

EP 0513662 and U.S. Pat. No. 5,310,607 (Balzers) describe an $(Al,Cr)_2O_3$ hard-metal layer, a tool coated with it and a process for producing that layer whereby, from a crucible serving as the anode for a low voltage arc (LVA) discharge, Al and Cr powder is jointly vaporized and deposited on tools in an $Ar/O_2$ atmosphere at about 600° C. The coating exhibits residual compressive stress and consists essentially of mixed crystals with a Cr content in excess of 5%, its thermodynamic stability enhanced by a high aluminum content, its abrasion resistance enhanced by an increased chromium concentration. While on the basis of a purported 202 line the layer is referred to as a modified α-aluminum oxide (corundum) with a shift reflecting the chromium content, all other corundum lines are missing in the analyses performed. Their described advantages notwithstanding, these coatings have failed to establish themselves as an industrial standard since due to their insulating properties their fabrication by the stated LVA technique entails process-related problems in continuous operation.

The three documents mentioned below describe ways to circumvent these process-related problems by the deposition of an at least adequately conductive layer of a ternary nitride followed by an oxidation phase. All three documents, however, aim at providing an oxide layer or dispersion in a corundum structure to serve as a base for the epitaxial growth of an α-aluminum oxide layer. The latter is produced by an unbalanced magnetron sputtering (UBMS) process in an $Ar/O_2$ atmosphere with extensive process monitoring, using a plasma emission monitor (PEM), in order to keep the Al sputtering targets in a transitional range between a contaminated i.e. oxidic and a metallic surface.

U.S. Pat. No. 6,767,627 and JP No. 2002-53946 (Kobe) describe a coating system and a method for producing an α-aluminum oxide-containing layer structure. As a first step, by way of example, a TiAlN and an AlCrN hard layer are deposited, followed by the oxidation of at least the surface of the AlCrN hard layer, the result being a corundum-like lattice structure, with a lattice constant of between 0.4779 and 0.5 nm, as an intermediate layer on which the α-aluminum oxide layer (a=0.47587 nm) is deposited.

The authors claim to be able even at temperatures between 300 and 500° C. to produce layers of a corundum structure by employing an AlP process with a subsequent oxidation step, followed by the UBMS of aluminum oxide. Also, as an alternative, they describe aluminum oxide layers deposited on $Cr_2O_3$, $(Al,Cr)_2O_3$ and, respectively, $(Fe,Cr)_2O_3$ intermediate layers which as well were produced by UBMS in an $Ar/O_2$ atmosphere. In addition, making reference to JP5-208326, the authors mention the inadequate suitability of $(Al,Cr)_2O_3$ layers for the processing of steels in view of the reaction of chromium on the surface of the layer with the iron of the material being treated.

In contrast thereto, inventors of the same applicant acknowledge in the more recent US 2005 005 8850 (Kobe) that these techniques do in fact require temperatures of 650° C. to 800° C. since no oxidation takes place if the temperature is too low. Yet they only describe examples at temperatures of 700° and 750° C. and lay claim to a method whereby at least the oxidation phase or the precipitation of the aluminum oxide coat takes place at a temperature of 700° C. and above. Preferably, they say, both process steps are carried out at the same temperature. The inventors further describe the additional application of a Ti-containing diffusion barrier such as TiN, TiC, TiCN, among others, in order to prevent the harmful diffusion of the oxygen through the oxide layer into the substrate, which would occur at these high temperatures.

WO 2004 097 062 (Kobe) as well sees a need for improvement on the invention described in JP No. 2002-53946. The starting point in this case is an attempt whereby, as in JP No. 2002-53946, CrN is oxidized at 750° C. whereupon, at the same temperature, aluminum oxide is deposited by a PEM-monitored sputter process in an $Ar/O_2$ atmosphere. While this does result in crystalline layers, these become increasingly coarse-grained and thus excessively rough with the progressive augmentation of the layer thickness. WO 2004 097 062 tries to solve that problem with a method whereby the growth of the aluminum oxide crystals is interrupted either at periodic intervals by thin oxide layers of different metal oxides which as well grow along a corundum structure, such as $Cr_2O_3$, $Fe_2O_3$, $(AlCr)_2O_3$, $(AlFe)_2O_3$, or at least by the periodic dispersion of such oxides. The layer regions encompassing those other metal oxides are supposed to be held at less than 10 and preferably even less than 2%. It would appear, however, that the long coating times involved in producing these layers, at about 5 hours for 2 μm, are hardly practical for industrial processes.

A publication by Ashenford [Surface and Coatings Technology 116-119 (1999), 699-704], describes the growing of aluminum oxide of a corundum structure and chrome oxide of an eskolaite structure in a temperature range between 300° C. and 500° C. The eskolaite structure of the chrome oxide is similar to the corundum structure of the aluminum oxide, albeit with somewhat modified lattice parameters. The objective of the tests, performed with an MBE system in the UHV range, was to use chrome oxide of a corundum structure as a crystallization base for growing the corundum high temperature phase of the aluminum oxide. In the process the oxygen is excited by the plasma, the metals are vaporized separately by elemental sources so disposed that the material flows reach the substrate at the same time. In the temperature range explored, between 300 and 500° C., steel substrates permitted the deposition of amorphous aluminum oxide only, whereas, largely independent of the pretreatment of the steel substrates, chrome oxide grows as a polycrystalline layer with an eskolaite structure. Still, it was not possible to produce a pure α-aluminum oxide even on eskolaite layers since in that temperature range, at an aluminum concentration of 35 at % and up, the crystalline structure flips into amorphous aluminum oxide within just a few monolayers. The practical results were then confirmed by simulated calculations using a semi-empirical model, predicting a destabilization of the α-aluminum oxide by oxygen defects in favor of a κ-modification.

EP 0 744 473 B1 describes a sputter process which for substrate temperatures below 700° C. provides a layer that consists of an α- and γ-phase of the aluminum oxide and is completely crystalline but exhibits high residual compressive stress patterns of at least 1 GPa. The interface layers between the tool and the aluminum oxide layer are said to be metals compounded with O, N and C.

To summarize, it can be said that, in terms of producing oxides with a corundum structure using PVD processes, prior art has for more than 10 years endeavored to come up with α-aluminum oxide layers that can match the layer long successfully obtained with CVD but without the drawbacks inherent in the CVD process. The techniques applied, however, are so complex, error-prone and cumbersome that to this day there has only been one manufacturer that offers an amorphous aluminum oxide layer but still no crystalline and especially no α-aluminum oxide layers for tool-coating purposes. For similar reasons there are still no other pure oxide layers available, in particular thick oxide layers, even though it is evident from the available gamut of oxynitrides, oxycarbonitrides etc. that in the tool market there is a great demand for thermochemically resistant coatings.

DEFINITIONS

The term thermally stable, for the purpose of this invention, defines layers which, exposed to air within a temperature range from room temperature to at least 900° C., preferably 1000° C. and especially 1100° C., reveal no changes in their crystal structure, hence no significant changes in their x-ray diffraction pattern and thus in their lattice parameters. Coatings of this type, if they exhibit a corresponding hardness of at least 1500 HV but preferably at least 1800 HV, are of particular interest for tools exposed to high thermal stress, since no phase conversion processes are to be expected during the machining cycle, and because they offer clearly superior thermal hardness compared to other coatings.

The term stress-free refers to layers which in test procedures, described in more detail below, have exhibited minor if any compressive or tensile stress. Consequently, a shift for instance of the interplanar spacing or the lattice constant of $(AlCr)_2O_3$ layers, established through a linear interpolation between the lattice constants of the binary compounds α-$Al_2O_3$ and α-$Cr_2O_3$, will provide a direct indication of the Al and, respectively, Cr content of the layer (Vegard's Law).

This is in contrast to the PVD methods described for instance in EP 0513662 and EP 0744473. The layers discussed in these documents, grown with mechanical bias due to the inclusion of inert-gas atoms, to direct-current bias or for other reasons, exhibit high residual compressive stress in excess of one GPa, which in the case of thicker layers often leads to spalling.

By comparison, CVD coatings are usually subject to tensile stress as a result of the different thermal expansion coefficients of the coating and the base material during the cooling-off of the high precipitation temperatures that are typical of the process. For example, according to US 2004202877 the deposition of α-$Al_2O_3$ requires temperatures of between 950 and 1050° C. This, apart from the additional problem of an unavoidable concentration of undesirable decomposition products (such as halogens), constitutes the main drawback of the CVD coating process, since such stress leads to fissuration, for instance ridge cracks, making these coatings less than suitable for machining processes such as jump cutting.

The term multi-oxides refers to compounds of at least two or more metals with an oxide. It also refers to the oxides of one or more metals which additionally encompass one or several semiconductor elements such as B or Si. Examples of such oxides include the cubic double or multi-oxides of aluminum, known as spinels. This present invention, however, relates to oxides with a corundum-type isomorphous α-aluminum oxide structure composed of $(Me1_{1-x}Me2_x)_2O_3$ where Me1 and Me2 each comprise at least one of the elements Al, Cr, Fe, Li, Mg, Mn, Ti, Sb or V and where the Me1 elements differ from the Me2 elements.

Measuring Methodology

To permit a better comparison, the following will briefly discuss individual methods and equipment used in determining specific layer characteristics.

X-Ray Diffraction Analyses

For the analysis of the XRD spectra and the lattice constants calculated on the basis of the latter, the equipment employed was a D8 X-ray diffractometer by Bruker-AXS, with a Goebel mirror, a Soller slit and an energy-dispersive detector.

The simple θ-2θ measurement was performed in a Bragg-Brentano geometry with Cu-kα radiation, no grazing incidence.

Angular range: 20 to 90°, with rotating substrate,

Test duration: With a dwell time of 4 sec per 0.01° the test duration was 7 hrs 46 min (for 70°).

Measuring the Intrinsic Stress of the Layers

One method applied to measure the intrinsic stress of the layers was the Stoney bending strip method using carbide metal sticks (L=2r=20 mm, $D_s$=0.5 mm, $E_s$=210 GPa, $v_s$=0.29) and calculating the intrinsic stress along the following formula:

$$\sigma = \frac{E_s * D_s^2}{3 * L^2 d_j} * f$$

where $E_s$ . . . Young Module of the substrate, $D_s$ . . . total thickness of the substrate, $d_f$ . . . layer thickness, f . . . deflection, and f . . . free bar length.

Another method applied was the bending disk method, with the intrinsic stress calculated along the following formula:

$$\sigma = \frac{E_s}{(1-v_s)} * \frac{D_s^2 * 8}{6 * L^2} * \frac{f}{d_f}$$

where L=2r=20 mm, $D_s$=0.5 mm, $E_s$=210 Gpa, $v_s$=0.29.

Moreover, the deviation, determined by x-ray diffractometry, of the measuring points of a multi-oxide from the straight line determined by applying Vegard's Law provides an indication of the intrinsic stress patterns in a composite layer system.

Overview

It is the objective of this invention to offer improvements over the drawbacks of prior art, described in detail above, and to introduce a layer system that lends itself well to high-temperature applications and contains at least one thermally stable oxidic layer, as well as workpieces, in particular tools and components protected by said layer system. Another objective consists in a method for producing the layer system in such fashion that it is possible to simply, reliably and reproducibly coat workpieces and to adjust the properties of the layer system to varying applications.

This objective is achieved with a PVD layer system for the coating of workpieces, encompassing at least one mixed-crystal layer of a multi-oxide having the following composition:

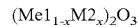

where Me1 and Me2 each comprise at least one of the elements Al, Cr, Fe, Li, Mg, Mn, Nb, Ti, Sb or V, with the elements of Me1 differing from those of Me2 and the crystal lattice of the mixed-crystal layer having a corundum structure which in a spectrum of the mixed-crystal layer, analyzed by x-ray diffractometry or electron diffraction, is characterized by at least three, preferably four and especially five lines associated with the corundum structure. Especially well suited are layer systems in which Me1 is aluminum and Me2 consists of at least one of the elements Cr, Fe, Li, Mg, Mn, Nb, Ti, Sb or V while 0.2 is $\leqq x \leqq 0.98$, preferably $0.3 \leqq x \leqq 0.95$. In this case, particular significance is attributed to aluminum as the element enhancing oxidation resistance as well as high-temperature hardness. Too high an aluminum content, however, has been found to pose a problem especially in producing the coatings since in particular at low coating temperatures these coatings form progressively smaller crystallites with a correspondingly diminished reflection intensity in the x-ray diffractogram.

For growing the layer in as undisturbed and stress-free a manner as possible, the concentration of halogens and inert gas in the mixed-crystal layer should in any event be less than 2%. This can be achieved by operating the sources with a process gas that consists of a minimum of 80%, preferably 90% and ideally even 100% of oxygen. The inert gas content in the mixed-crystal layer can then be limited to a maximum of 0.1 at %, preferably a maximum of 0.05 at % and/or the halogen content can be limited to a maximum of 0.5 at % and preferably to a maximum of 0.1 at %, or, in a best-case scenario, the mixed-crystal layer can preferably be produced essentially free of any inert gas and halogens.

The mixed-crystal coating can be built up in different ways. For example, the layer can be produced as a single or a multi-stratum coat from at least two different, alternatingly deposited multi-oxides. Alternatively, a multi-oxide can be deposited in an alternating sequence with another oxide. Multi-oxides that have been found to be particularly resistant to high temperatures are those produced by arc vaporization or sputtering of aluminum/chromium and aluminum/vanadium alloys. Other oxides with good high-temperature resistance characteristics and suitable for alternating deposition with multi-oxides include $HfO_2$, $Ta_2O_5$, $TiO_2$, $ZrO_2$ and $\gamma$-$Al_2O_3$, but especially oxides with a corundum structure such as $Cr_2O_3$, $V_2O_3$, $Fe_2O_3$, $FeTiO_3$, $Ti_2O_3$, $MgTiO_2$ and, of course, especially $\alpha$-$Al_2O_3$.

In generating the layer system it was found to be desirable to minimize any stress in the mixed-crystal layer so as to permit the deposition even of thick coatings that are needed especially for high-speed lathe work on metals. If the layer system is to feature additional characteristics such as a specific intrinsic stress pattern for the machining of hardened steels, particular antifriction qualities for improved chip removal or for use on sliding elements, enhanced adhesion to different substrates, or the like, such properties can be attained for instance by selecting an appropriate interstitial interface between the substrate and the mixed-crystal layer, consisting of at least one bonding and/or hard-metal layer, or by providing the mixed-crystal layer with one or several surface coats.

The hard-metal layer or surface coat preferably contains at least one of the metals of subgroups IV, V and VI of the periodic system, or Al, Si, Fe, Co, Ni, Co, Y, La or of such metals compounded with N, C, O, B, or mixtures thereof, compounds with N or CN being preferred. Compounds found to be particularly suitable for the hard-metal layer include TiN, TiCN, AlTiN, AlTiCN, AlCrN and AlCrCN, while the compounds that are especially suitable for the surface coat include AlCrN, AlCrCN, $Cr_2O_3$ or $Al_2O_3$ and in particular $\gamma$-$Al_2O_3$ or $\alpha$-$Al_2O_3$. Much like the mixed-crystal layer, the interface and/or the hard-metal layer may comprise several strata. The layer system may also be built up as a multilayer structure with an alternating interstitial and mixed-crystal layer or alternating surface coat and mixed-crystal layer.

The mixed crystals with a corundum structure can be produced employing arc-based methods without or, respectively, with a specially configured, small vertical magnetic field, by pulse-superposed arc techniques, as well as by general methods such as arc or sputter techniques where high-current pulses are fed to the material sources such as arc vaporizers or sputter sources or are superimposed on the DC base mode. This permits operation in the contaminated state, or alloying on the target, as long as certain prerequisites, explained in more detail below, are observed.

In connection with the arc-based techniques employed for producing the inventive layer system and in particular for producing the oxidic mixed-crystal layer, reference is also made to the following patent applications by the same claimant which in terms of the methodology represent the latest state of the art: WO 2006099758, WO 2006/099760 as well as CH 01166/06. All of the techniques were implemented using a Balzers RCS coating system To produce mixed crystals with a corundum structure it is important that in each process the target is an alloy target, because otherwise, as explained below, it will not be possible at precipitation temperatures below 650° C. to deposit an oxidic mixed-crystal layer with a corundum structure. In the interest of an as simple as possible, reproducible method the process parameters should be so selected that the metal composition, each metal component scaled to the total metal content, will not differ by more than 10%, preferably 5% and especially 3% from the concentration in the metal composition of the target. This is attainable for instance by observing the parameters indicated in the analytical examples, by selecting a rather low substrate bias of perhaps less than 100 V so as to prevent dissociation by an edge effect etc. Those skilled in the art can adjust and vary these parameters depending on the alloying system, for instance if there is a need to achieve a very high compressive stress.

Arc techniques in which no magnetic field is applied to the target surface, or only a small external magnetic field extending in a direction essentially perpendicular to the target surface, are generally suitable for producing multi-oxides according to this invention. If a magnetic field with a vertical component $B_z$ is applied, it will be desirable to set the radial or surface-parallel component $B_r$ over most but at least not less than 70% and preferably 90% of the target surface at a value smaller than $B_z$. The vertical component $B_z$ is set between 3 and 50 Gauss but preferably between 5 and 25 Gauss. This type of magnetic field can be generated for instance by means of a magnet system consisting of at least one axially polarized coil whose geometry fairly matches the target circumference. The coil plane may be positioned at the level of the target surface or preferably behind and parallel with the latter. The techniques described below, employing pulsed sources, lend themselves well to arc processes using sources that work with such weak magnetic fields or even without a magnetic field.

The following pulse-source techniques for producing in particular thermally stable mixed-crystal layers of multi-oxides with a corundum-type crystal lattice involve the simultaneous feeding of at least one arc source with a direct current and a pulsed or alternating current. A first electrode of an arc or sputter source, in the form of an alloy target, and a second electrode serve to deposit a coat on the workpiece, the source simultaneously being fed a direct current or DC voltage as well as a pulsed or alternating current or a pulsed or alternating AC voltage potential. The composition of the alloy target is essentially the same as that of the mixed-crystal layer. The preferred pulse frequency is in a range from 1 kHz to 200 kHz. The pulse current supply may permit operation also at some other pulse-width ratio or with interpulse periods.

The second electrode may be either separated from the arc source or constitute the anode of the arc source, with the first and the second electrodes connected to and powered by a single pulse current supply. If the second electrode does not serve as the anode of the arc source, the arc source can be connected to and operated with one of the following material sources via the pulse current supply:

Another arc vaporizing source that is itself connected to a DC power supply;

A cathode of a sputter source, in particular a magnetron source which as well is connected to a power supply, especially to a DC power supply;

A vaporizing crucible that doubles as the anode of a low voltage arc vaporizer.

The DC power supply delivers a base current in a manner whereby the plasma discharge is maintained essentially without interruption at least at the arc vaporizer sources but preferably at all sources.

It will be desirable to decouple the DC power supply and the pulse current supply by means of an electric decoupling filter that preferably contains at least one hold-off diode. The coating process can take place at temperatures below 650° C. and preferably below 550° C.

In this case the multi-oxide layers grow with a corundum-like structure in spite of the relatively low coating temperature and the bonding or intermediate layer that may be positioned underneath them perhaps as a cubic metal nitride or carbonitride layer, which is surprising given the fact that in earlier experiments in which coatings were produced through simultaneous vapor deposition on workpieces using elemental aluminum and chromium targets in an oxygen atmosphere only amorphous layers such as $(Al_{1-x}Cr_x)_2O_3$ were attainable. This was even the case when the coating range of the sources was set in overlapping fashion. Only when alloy targets are used is it possible, already at relatively low process temperatures, to deposit multi-oxides with a crystalline and especially corundum-like structure. It is also necessary to ensure that enough oxygen is available at the target, which is why a high oxygen content of at least 80% and preferably 90% is selected for the process gas or, as in the following Example #1), only oxygen is used as the process gas. During the arc process the target surface is promptly coated with a thin, nonconductive layer. In the opinion of the inventors, the growth of a crystalline layer and especially one with a corundum-like structure, which used to be possible at much higher temperatures only, at a lower temperature can be attributed to the formation of multi-oxides on the target surface which evaporate during the process, initially form growth nuclei on the workpiece and ultimately participate in the build-up of the layer. There are several reasons pointing to this growth mechanism. For one, the temperatures generated on the target surface by the arc are within the melting point of the alloy, which in the presence of a sufficiently high oxygen concentration establishes a good basis for the formation of high-temperature-stable corundum-like multi-oxide structures. For another, as mentioned above, the simultaneous vapor deposition of elemental aluminum and chromium targets failed to produce mixed crystals. Similar results were obtained with oxide layers employing a sputtering process. For example, in tests analogous to those per U.S. Pat. No. 6,767,627 the inventors authoring this patent application produced aluminum oxide and aluminum-chrome oxide layers in a temperature range between 400 and 650° C. by sputtering, although crystalline aluminum oxide or aluminum-chrome oxide layers having a corundum structure could not be established. Nor were attempts using alloy targets successful, which may be due to the typical absence in a sputtering process of a thermal excitation on the substrate surface, and to the fact that the target surface does not sputter compounds but atoms only.

While at this juncture there is no factual proof, for instance by a spectrographic analysis, of such a formation mechanism, and while perhaps other mechanisms are a factor in this, it can nevertheless be stated that this present invention makes it possible for the first time to produce multi-oxides with a distinctly verified corundum lattice structure at a coating temperature of between 450 and 600° C.

To further increase the thermal excitation on the target surface, individual experiments were conducted with uncooled or heated targets, vaporizing material in an oxygen atmosphere on the nearly red-hot target surface. Even layers produced in that fashion exhibit a corundum-like lattice. At the same time, the rising discharge voltages in these processes point to an increased plasma impedance which is attributable to the increased electron emission of glowing surfaces in combination with an elevated vapor pressure, further intensified by the pulsation of the source current.

Another way to produce oxide layers according to this invention is through the operation of a high-power arc discharge with at least one source. This is attainable for instance by operating the pulse current source or pulsed power supply with pulse slopes that are generated at least in the range from 0.02 V/ns to 2.0 V/ns, preferably in the range from 0.1 V/ns to 1.0 V/ns. The currents applied are at a level of at least 20 A but preferably equal to or greater than 60 A, with voltages between 60 and 800 V, preferably between 100 and 400 V, respectively above or in addition to the voltage and current of the simultaneous DC discharge. These voltage spike pulses can be generated for instance by means of one or several condenser cascades which, apart from a few other advantages, also makes it possible to alleviate the load on the basic power supply. Preferably, however, the pulse generator is connected between two simultaneously DC-powered arc sources. Surprisingly, by applying the spike impulses in the arc process, it is possible to increase the voltage at the source over several μs as a function of the magnitude of the voltage signal applied, whereas pulses with a flatter slope will result in an increased source current, as would be expected.

Initial experiments have shown that it is also possible with these high-current discharges to produce from sputter sources with alloy targets oxidic multi-oxides with corundum, eskolaite or comparable hexagonal crystal structures, which can presumably be ascribed to the increased energy density on the target surface and the concomitant temperature increase, so that here as well the use of uncooled or heated targets, described above, could prove beneficial. For processes of that nature the high-power discharge exhibits similar characteristics for both high-power arcing and high-power sputtering, corresponding to the anomalous glow discharge pattern known from Townsend's current-voltage diagram. The convergence on that range occurs from mutually opposite sides, one being the arc discharge of the arc technique (low voltage, high current), the other being the glow discharge of the sputter technique (medium voltage, low current).

Approaching the stage of an anomalous glow discharge from the high-current side, i.e. the "arc side", will in any event require measures aimed at increasing the impedance of the plasma or of the target surface (explained above). As stated, this can be accomplished by the superposition of spike pulses, by heating the target surface or by a combination of these measures.

Another way to increase the plasma impedance is to pulse the magnetic field of the source. This can be accomplished by means of the pulse current of the source which, either entirely or as a partial current, is passed through a magnetic system composed of an axially polarized coil as described above. In this case, in adaptation to the high current peaks, cooled coils with a small number of turns (1 to 5) can be used if necessary.

From the above explanations and the tests described below it will be evident that layer systems according to this invention are in general superbly suited to tool-coating applications. These layer systems can thus be advantageously applied on such tools as milling cutters, drills, gear cutting tools, interchangeable cutting inserts, cut-off tools and broaches made of different metals such as cold working and hot forming tool steel, HSS steel as well as sintered materials such as powder metallurgical (PM) steel, carbide or hard metal (HM), cermets, cubic boronitride (CBN), silicon carbide (SiC) and silicon nitride (SiN). They lend themselves particularly well, however, to tool applications involving high machining temperatures or cutting speeds as for instance in lathe work, high-speed milling and the like, which, apart from abrasion resistance, are subject to highly demanding requirements in terms of thermochemical stability of the hard-metal layer. Nowadays, these tools use primarily CVD-coated interchangeable inserts, often with coatings between 10 and 40 μm thick. In view of their above-described properties, the layers according to the invention constitute a preferred application for coated interchangeable inserts, with particular emphasis on interchangeable inserts made of PM steel, carbide metal, cermet, CBN, SiC, SiN sintered metals, or interchangeable inserts precoated with a polycrystalline diamond layer.

While the emphasis of the work performed in connection with this invention was primarily focused on the development of protective coatings for metal-cutting tools, it is of course possible to use these layers to advantage in other fields as well. For example, they can be assumed to be quite suitable for tools used in various hot-forming processes, for instance in the precision forging and swaging or die-casting of metals and alloys. Given their high chemical resistance these layers can also be used on tools for plastics processing such as injection and compression molding equipment for producing preformed components.

Other application possibilities exist in the realm of parts and components coating for instance of heat-exposed components of combustion engines, including fuel injection nozzles, piston rings, tappets, turbine blades and similarly stress-exposed parts. In these cases as well, much like those discussed above and at least in areas exposed to wear, the following basic materials can be employed: Cold working steel, HSS steel, PM steel, HM, cermet or CBN-sintered metals.

Even for thermally stable sensor layers, coatings can be deposited by the method according to the invention, such as piezoelectric and ferroelectric materials and all the way to quaternary superconductive oxide layers. It will be understood that these coatings are not limited to any particular substrate structure and that in this context their application is indicated especially in connection with silicon-based MEMS.

EXAMPLES AND FIGURES

Figure 2:
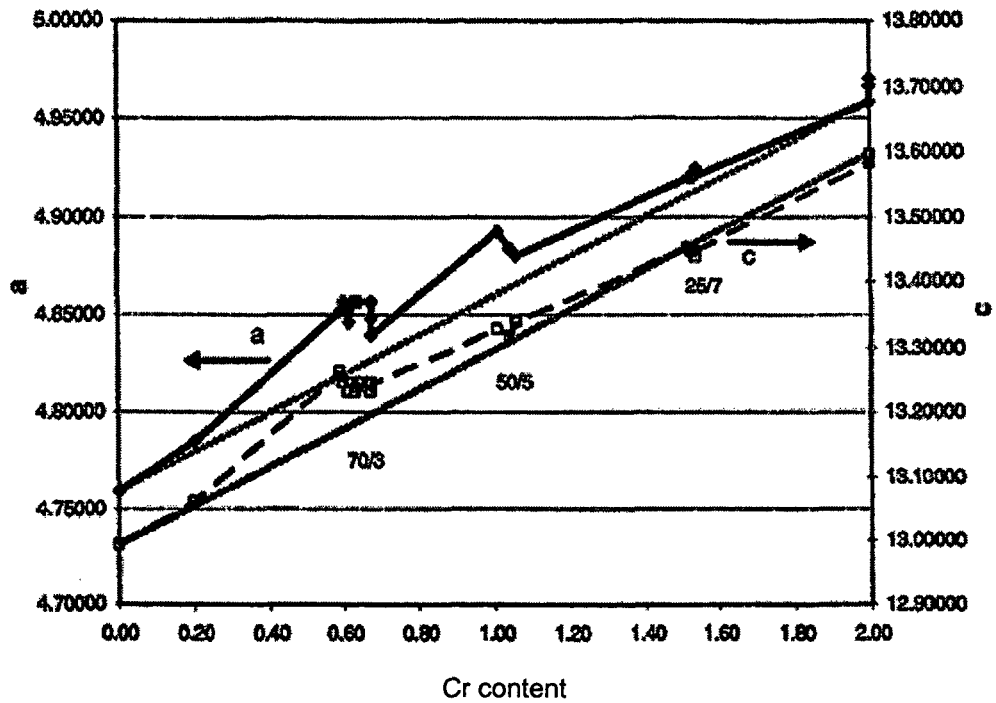
Figure 3:
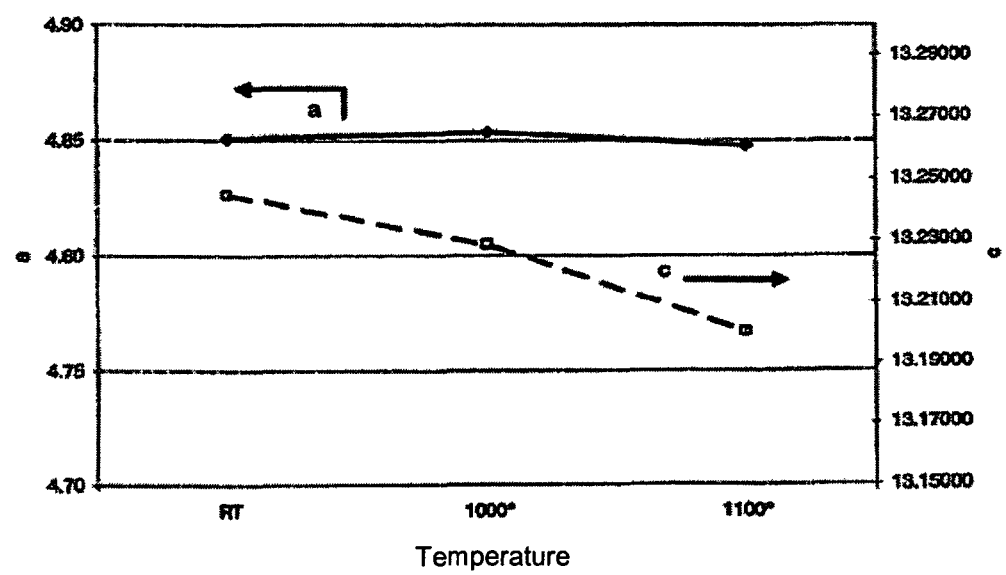
Figure 4:
Figure 5:
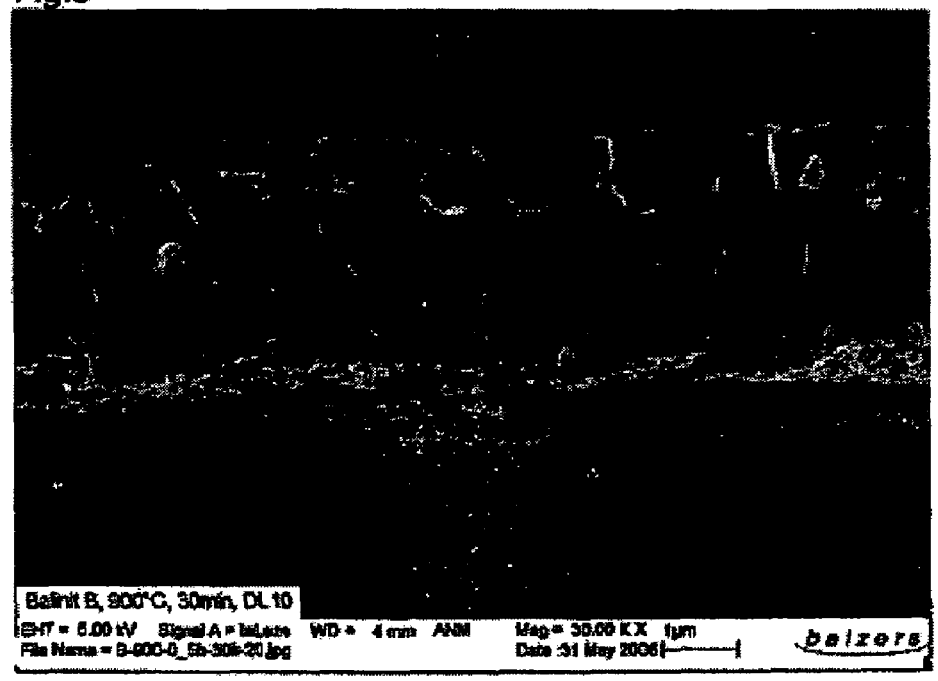
Figure 6:
Figure 7:

The following will explain this invention with the aid of examples and with reference to the exemplary figures which illustrate the following:

FIG. 1 X-ray spectra of $(Al_{1-x}Cr_x)_2O_3$ layers;
FIG. 2 Lattice parameters of $(Al_{1-x}Cr_x)_2O_3$ layers;
FIG. 3 Temperature pattern of the lattice parameters;
FIG. 4 Oxidation pattern of a TiAlN layer;
FIG. 5 Oxidation pattern of a TiCN layer;
FIG. 6 Oxidation pattern of a TiCN/$(Al_{1-x}Cr_x)_2O_3$ layer;
FIG. 7 Detail of a $(Al_{1-x}Cr_x)_2O_3$ layer.

The example per test #1), described below in more detail, covers a complete coating cycle according to the invention, employing a weak, essentially vertical magnetic field in the area of the target surface.

The workpieces were placed in appropriately provided double- or triple-rotatable holders, the holders were positioned in the vacuum processing chamber, whereupon the vacuum chamber was pumped down to a pressure of about $10^{-4}$ mbar.

For generating the process temperature, supported by radiation heaters, a low voltage arc (LVA) plasma was ignited between a baffle-separated cathode chamber housing a hot cathode and the anodic workpieces in an argon-hydrogen atmosphere.

The following heating parameters were selected:

| | |
|---|---|
| Discharge current (LVA) | 250 A |
| Argon flow | 50 sccm |
| Hydrogen flow | 300 sccm |
| Process pressure | $1.4 \times 10^{-2}$ mbar |
| Substrate temperature | approx. 550° C. |
| Process duration | 45 min |

Those skilled in the art will be familiar with possible alternatives. As a matter of preference the substrate was connected as the anode for the low voltage arc and also preferably pulsed in unipolar or bipolar fashion.

As the next procedural step the etching was initiated by activating the low voltage arc between the filament and the auxiliary anode. Here as well, a DC-, pulsed DC- or AC-operated MF or RF power supply can be connected between the workpieces and frame ground. By preference, however, a negative bias voltage was applied to the workpieces.

The following etching parameters were selected:

| | |
|---|---|
| Argon flow | 60 sccm |
| Process pressure | $2.4 \times 10^{-3}$ mbar |
| Discharge current, LVA | 150 A |
| Substrate temperature | approx. 500° C. |
| Process duration | 45 min |
| Bias | 200-250 V |

The next procedural step consisted in the coating of the substrate with an AlCrO layer and a TiAlN interface layer. If higher ionization is needed, all coating processes can be assisted by means of the low voltage arc plasma.

For the deposition of the TiAlN interface layer the following parameters were selected:

| | |
|---|---|
| Argon flow | 0 sccm (no argon added) |
| Nitrogen flow | Pressure-regulated to 3 Pa |
| Process pressure | $3 \times 10^{-2}$ mbar |
| DC source current TiAl | 200 A |
| Coil current of the source magnetic field (MAG 6) | 1 A |
| DC substrate bias | U = −40 V |
| Substrate temperature | approx. 550° C. |
| Process duration | 120 min |

For the transition of about 15 min to the actual functional layer the AlCr arc sources were switched on with a DC source current of 200 A, with the positive pole of the DC source connected to the annular anode of the source and to frame ground. During that phase a DC substrate bias of −40 V was applied to the substrate. 5 minutes after activation of the AlCr (50/50) targets the oxygen inflow was started and was then ramped up within 10 min from 50 to 1000 sccm. At the same time the TiAl (50/50) targets were turned off and the $N_2$ was reduced back to approx. 100 sccm. Just before the introduction of oxygen the substrate bias was switched from DC to bipolar pulses and increased to U=−60 V. That completed the interface layer and the transition to the functional layer. The targets were powder-metallurgically produced targets. Alternatively, melt-metallurgical targets may be used as well. To reduce the spattering rate, monophase targets as described in DE 19522331 may be used.

The coating of the substrate with the actual functional layer took place in pure oxygen. Since aluminum oxide constitutes an insulating layer, either a pulsed or an AC bias supply was used.

The key functional-layer parameters were selected as follows:

| | |
|---|---|
| Oxygen flow | 1000 sccm |
| Process pressure | $2.6 \times 10^{-2}$ mbar |
| DC source current, AlCr | 200 A |
| Coil current of the source magnetic field (MAG 6) | 0.5 A, which generated on the target surface a weak, essentially vertical field of approx. 2 mT (20 Gs). |
| Substrate bias | U = 60 V (bipolar, 36 µs negative, 4 µs positive) |
| Substrate temperature | approx. 550° C. |
| Process duration | 60 to 120 min |

The process described yielded well-bonded, hard layers. Comparison tests of the coating on lathe-work and milling tools revealed a product life significantly improved over traditional TiAlN coatings, although the surface roughness was clearly higher than the roughness values of optimized pure TiAlN coatings.

The test examples #2 to #22 shown in Table 1 refer to simple layer systems according to the invention, each consisting of a double oxide layer of the $(Al_{1-x}Cr_x)_2O_3$ type produced at a coating temperature of between 450 and 600° C. The remaining parameters were identical to the parameters described above for producing the functional layer. The stoichiometric component of the layer composition was measured by Rutherford backscattering spectrometry (RBS). The largest deviation from the target alloy composition shown in column 2 was encountered in tests #10 to #12, with a deviation of 3.5 percentage points at a 70/30 Al/Cr ratio. The metal components of the layer are scaled to the total metal content of the oxide. In terms of the stoichiometry of the oxygen, however, there were somewhat greater deviations of up to over 8%. All layers nevertheless exhibited a clearly corundum-like lattice structure. Preferably, therefore, layers produced according to the invention should have an oxygen-related stoichiometry shortage of 0 to 10% since even with an oxygen deficit of as much as 15% the desired lattice structure will be obtained.

Figure 1B:
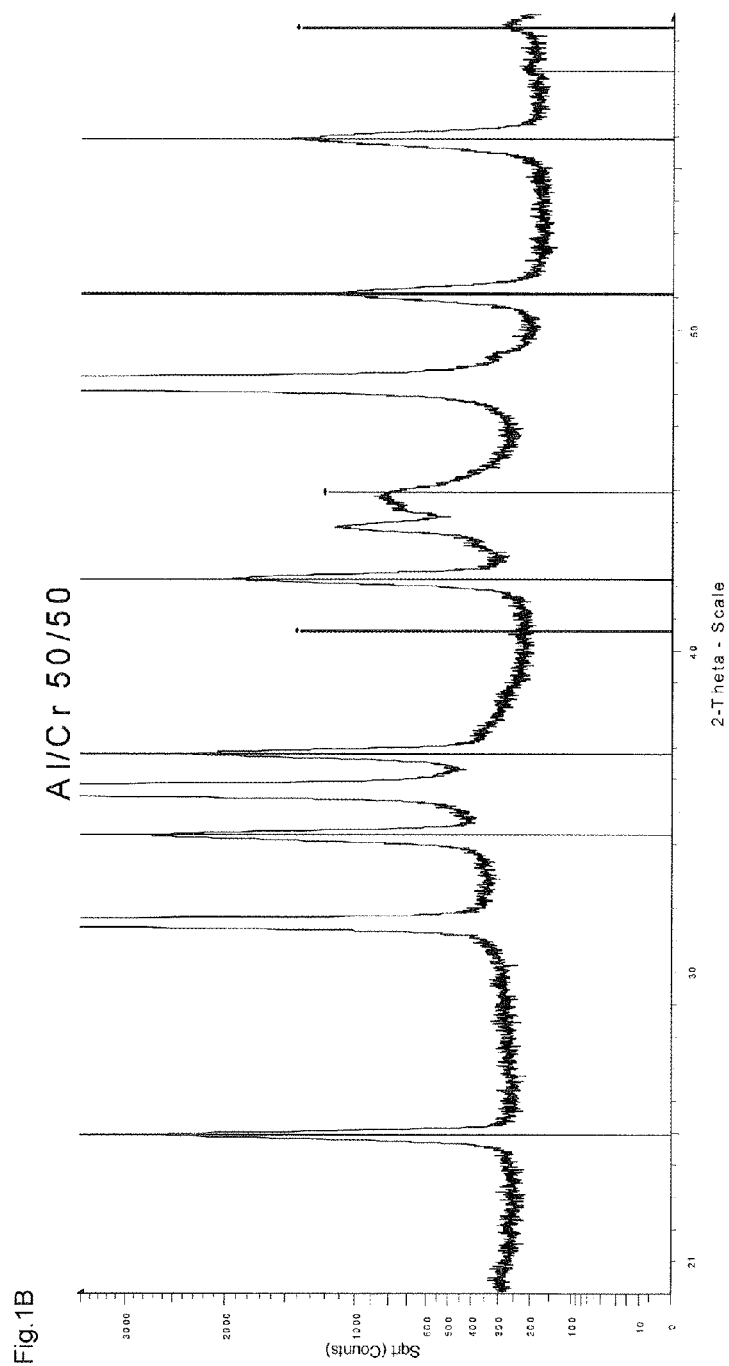
Figure 1C:
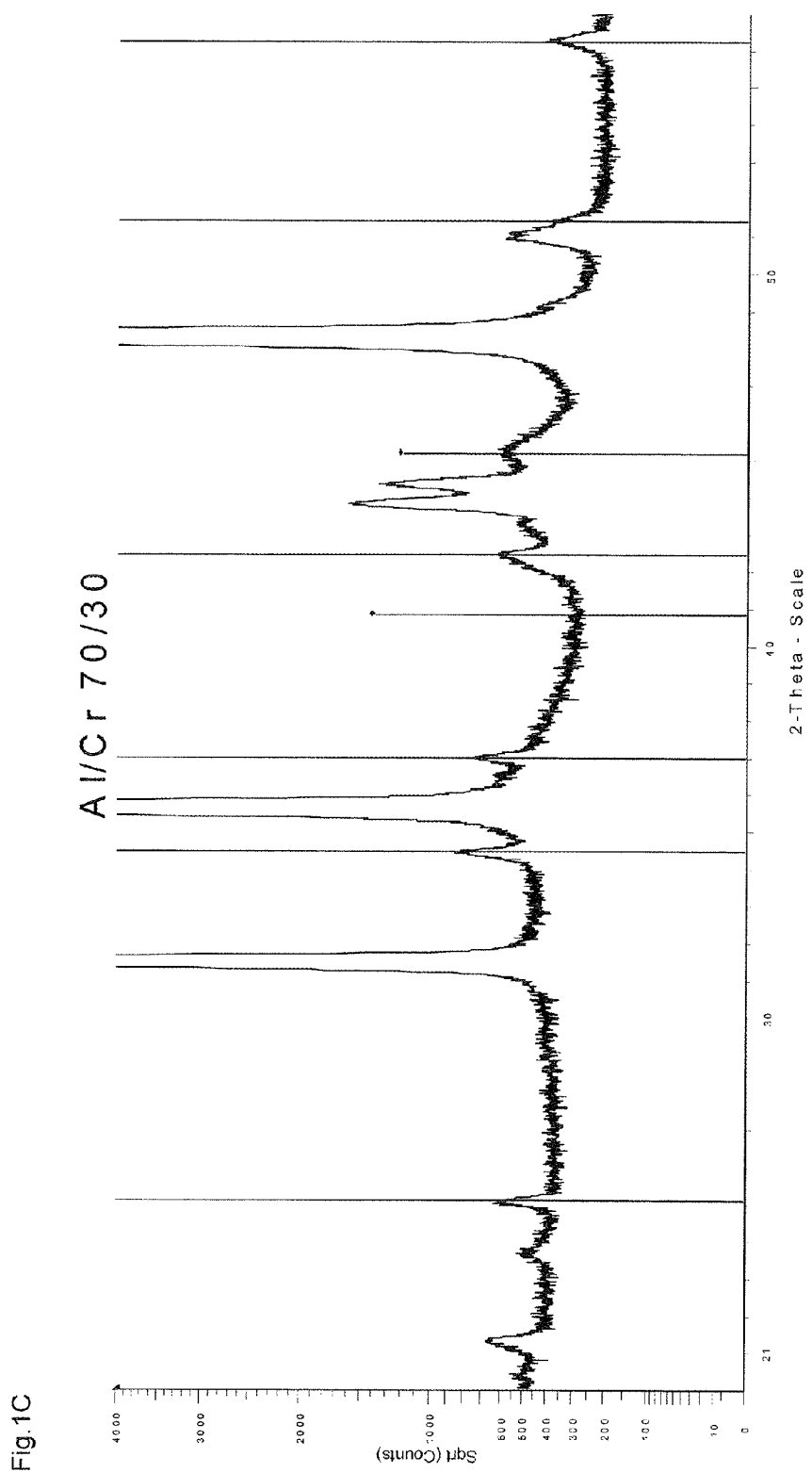

FIG. 1 A to C show typical corundum structures of $(Al_{1-x}Cr_x)_2O_3$ layers produced at 550° C. in accordance with the invention, with targets of varying alloys as indicated in tests #18 (Al/Cr=25/75), #14 (50/50) and #3 (70/30). The measurements and analyses were obtained by x-ray diffractometry with the parameter selections described in more detail under Measuring Methodology, above. In the illustration any correction for background noise was dispensed with. Lattice parameters can be determined by other means as well, such as electron diffraction spectrometry. Due to the decreasing layer thickness from FIG. 1A to 1C, from 3.1 to 1.5 µm, there is a strong increase of the unmarked substrate lines relative to the dash-marked layer lines of the corundum structure. But even in spectrum C, the linear presentation of the Y-axis notwithstanding, 7 lines can still be clearly associated with the corundum lattice. The remaining lines belong to the basic tungsten carbide metal (WC/Co alloy). Of course, for an unambiguous association of the crystal lattice and the determination of the lattice constants, at least 3 and preferably 4 to 5 lines should be uniquely identifiable.

The crystal structure of the layers is compact-grained, in large measure with an average crystallite size of less than 0.2 µm. Only in cases of large chromium concentrations and at coating temperatures of 650° C. were crystallite sizes found to be between 0.1 and 0.2 µm.

For the tests #2 to #22, FIG. 2 shows the lattice constants a (solid line) and c (dashed line) of the $(Al_{1-x}Cr_x)_2O_3$ crystal lattice plotted above the stoichiometric chromium content and comparing them with the dotted straight lines determined by three values DB1 to DB3 from the ICDD (International Center for Diffraction Data), applying Vegard's Law. Over the entire concentration range the maximum deviation from the ideal Vegard's straight line is 0.7 to 0.8%. Measurements taken on other multi-oxide layers showed similar results, with deviations for the parameters indicated amounting to a maximum of 1%. This suggests very low intrinsic stress in the mixed-crystal layer, which is why, in contrast to many other PVD layers, it is possible to deposit these coatings with a greater layer thickness for instance between 10 and 30 µm, in some cases even up to 40 µm, with good bonding qualities. Larger stress patterns in the layer were obtained only by applying greater substrate voltages (>150) and/or by using an $Ar/O_2$ mixture of the process gas with a high Ar component. Since for many applications it is especially the multilayer systems, described in more detail below, that are well suited, it is possible within a wide range to adjust, where necessary, the layer stress values by selecting perhaps a multistratum interface layer and/or cover layer between the workpiece and the mixed-crystal layer. For example, this allows for the selection of higher residual compressive stress values to increase the hardness of the coating for hard-metal machining processes. For industrial applications involving a high level of abrasive wear, thick layer systems with layers more than 10 or 20 am thick can be produced economically, with the mixed-crystal layer preferably having a thickness of more than 5 and especially more than 8 µm.

Parallel tests were performed on mixed-crystal layers 2 µm thick, employing the methods described above (Stoney's bending strip method and bending disk method). The layer stress values measured ranged from stress-free to minor compressive and tensile stress values less than or equal to 0.5 GPa. However, thicker PVD coatings can still be deposited with layers exhibiting a somewhat higher layer stress of about 0.8 GPa. Another possibility consists in a sequence of thin layers (≦1 µm) deposited with alternating tensile and compressive stress, constituting a multilayer system.

As shown in Table 2, test #2, the temperature and oxidation resistance of the corundum structure of the deposited $(Al_{1-x}Cr_x)_2O_3$ layers was tested by heating coated carbide metal test objects with an elevated Co content to a temperature of 1000° and, respectively, 1100° C. over a period of 50 minutes, then holding them there for 30 minutes and finally cooling them to 300° C. over a time span of 50 minutes. Once cooled to room temperature, the lattice constants were reevaluated. According to the phase diagram [W. Sitte, Mater. Sci. Monogr., 28A, React. Solids 451-456, 1985] referred to in Phase Equilibria Diagrams Volume XII Oxides published by the American Ceramic Society, there is a miscibility gap in the range between about 5 and 70% aluminum, i.e. $(Al_{0.05-0.7}Cr_{x0.95-0.30})_2O_3$ for temperatures up to about 1150° C., which would predict a segregation of the $(Al_{1-x}Cr_x)_2O_3$ mixed crystal into $Al_2O_3$ and $Cr_2O_3$ and an $(Al_{1-x}Cr_x)_2O_3$ mixed crystal of some other composition. From that diagram it is also evident that with the process according to this invention it is possible to shift the thermodynamic formation temperature for $(Al_{1-x}Cr_x)_2O_3$ mixed-crystal layers from 1200° C. to between 450° and 600° C. Surprisingly it was also found that the mixed-crystal layers produced by this inventive method experience only minimal changes in their lattice constants as a result of the glow process and that there is no segregation into their binary components. The maximum deviation, shown in FIG. 3, of the value of the lattice parameters a and of the red hot sample, measured after the coating process at room temperature, is about 0.064% while the maximum deviation of value c is 0.34%. For various other multi-oxides as well, the measurements revealed an extraordinary thermal stability of the layer with a minor deviation of the lattice constants by 1 to 2% at the most.

FIGS. 4 and 5 show the results of oxidation tests on conventional layer systems based on an REM fracture pattern of a TiAlN and a TiCN layer, heated to 900° C. as described above and then glowed at that temperature for 30 minutes in an oxygen atmosphere. In a range of over 200 nm the TiAlN layer reveals a distinct alteration of its surface structure. A thin outer layer, consisting essentially of aluminum oxide and having a thickness of between 130 and 140 nm, is followed by a porous aluminum-depleted layer with a thickness of between 154 and 182 nm. Much poorer yet is the oxidation pattern of the TiCN layer in FIG. 5 which, subjected to the same treatment, has oxidized right down to the base material and reveals an incipient layer separation on the right side in the illustration. The layer is coarse-grained and no longer features the columnar structure of the original TiCN layer.

FIG. 6 and FIG. 7 show the results of identical oxidation tests on a TiCN layer protected by an $(Al_{0.7}Cr_{0.3})_2O_3$ layer, about 1 μm thick, according to this invention. FIG. 6 is a 50,000× magnification of the interlaminar bonding. The known columnar structure of the TiCN layer and the slightly finer crystalline $(Al_{0.7}Cr_{0.3})_2O_3$ layer are clearly recognizable. The crystallite size of the aluminum/chrome oxide layer can be further refined by using targets with a higher Al content. FIG. 7 is a 150,000× magnification of the interlaminar bond, with the TiCN layer still visible only at the bottom edge of the image. Compared to the layers in FIG. 4 and FIG. 5 the reaction zone of the $(Al_{0.5}Cr_{0.5})_2O_3$ layer with a height H2 of maximally 32 nm is substantially narrower, having a dense structure without detectable pores. A series of comparison tests with different mixed-crystal layers according to the invention revealed that, unlike other, prior-art, oxide layers, they protect the intermediate layers underneath, thus giving the entire layer system excellent heat and oxidation resistance. It is generally possible to use for this purpose all inventive mixed-crystal layers which in the oxidation test described do not form reaction zones larger than 100 nm. The preferred mixed-crystal layers are those with reaction zones between 0 and 50 nm.

The hardness values of the $(Al_{0.5}Cr_{0.5})_2O_3$ layers were determined to be about 2000 $HV_{50}$. Measurements performed on other multi-oxides such as $(Al_{0.5}Ti_{0.3}Cr_{0.2})_2O_3$, or $(Al_{0.6}Ti_{0.4})_2O_3$, $(V_{0.5}Cr_{0.5})_2O_3$, $(Al_{0.2}Cr_{0.8})_2O_3$, on their part yielded values between 1200 and 2500 HV.

Tables 3 to 6 list additional multilayer implementations of the layer system according to the invention. Process parameters for producing AlCrO and AlCrON mixed-crystal layers on a 4-source coating system (RCS) are shown in Table 7 while corresponding process parameters for producing individual strata for various support layers are shown in Table 8.

The tests #23 to #60 in Tables 3 and 4 refer to layer systems in which the oxidic mixed-crystal layer is of a corundum structure throughout and is mostly formed as a monolayer. Only in tests #25, #29 and #31 the mixed-crystal layer is formed from two consecutive individual strata of different chemical compositions. In test #29 the only difference between the mixed-crystal layers is their respective Al/Cr ratio.

The tests #61 to #107 in Tables 5 and 7 refer to layer systems in which the mixed-crystal layer is composed of 5 to as many as 100 very thin strata measuring between 50 nm and 1 μm. In these cases, there may be alternating oxidic mixed-crystal layers of a corundum structure with different chemical compositions and corresponding mixed-crystal layers with different layer systems.

In comparison tests on various turning and milling tools, the layers used in tests #23, #24 and #61 to #82 proved clearly superior in turning and milling applications over conventional layer systems such as TiAlN, TiN/TiAlN and AlCrN. Even when compared to CVD coatings, tool product-life improvements were achieved in the milling arena and in some lathe applications.

Although, as stated above, analyses and tests have already been conducted on a substantial number of layer systems, those skilled in the art will use conventional measures, where necessary, to adapt certain characteristics of the inventive layer system to specific requirements. For example, one may consider adding further constituent elements to individual or all layers of the system but in particular to the mixed-crystal layer. Elements known to improve for instance the heat resistance at least of nitridic layers include Zr, Y, La or Ce.

TABLE 1

| V-No. | Target [Al/Cr] | Depos'n Temp. [° C.] | Glow Temp. [° C.] | Stoichiometric Component | | | Cr/(Cr + Al) | Lattice Constants | | | d [μm] |
|---|---|---|---|---|---|---|---|---|---|---|---|
| | | | | Cr | Al | O | | a | c | c/a | |
| DB1 - $Al_2O_3$ | | | | 0.00 | 2.00 | 3.00 | 0.00 | 4.75870 | 12.99290 | 2.7303 | |
| DB2 - 90/10 | | | | 0.20 | 1.80 | 3.00 | 0.10 | 4.78550 | 13.05900 | 2.7289 | |
| 2 | 70/30 | 550° | — | 0.59 | 1.41 | 3 | 0.30 | 4.85234 | 13.26296 | 2.7333 | |
| 3 | 70/30 | 550° | — | 0.60 | 1.40 | 2.80 | 0.30 | 4.85610 | 13.24587 | 2.7277 | 1.5 |
| 4 | 70/30 | 600° | — | 0.61 | 1.39 | 3.00 | 0.31 | 4.84603 | 13.23092 | 2.7303 | 3.3 |
| 5 | 70/30 | 550° | — | 0.62 | 1.38 | 2.75 | 0.31 | 4.85610 | 13.24587 | 2.7277 | 3.0 |
| 6 | 70/30 | 550° | — | 0.64 | 1.36 | 3.1 | 0.32 | 4.85610 | 13.24587 | 2.7277 | 3.1 |
| 7 | 70/30 | 550° | — | 0.63 | 1.37 | 2.90 | 0.32 | 4.85612 | 13.23089 | 2.7246 | 2.9 |

TABLE 1-continued

| V-No. | Target [Al/Cr] | Depos'n Temp. [° C.] | Glow Temp. [° C.] | Stoichiometric Component | | | Cr/(Cr + Al) | Lattice Constants | | | d [μm] |
|---|---|---|---|---|---|---|---|---|---|---|---|
| | | | | Cr | Al | O | | a | c | c/a | |
| 8 | 70/30 | 550° | — | 0.67 | 1.33 | 2.8 | 0.34 | 4.88443 | 13.15461 | 2.6932 | 2.7 |
| 9 | 70/30 | 550° | — | 0.68 | 1.32 | 2.95 | 0.34 | 4.86815 | 13.15461 | 2.7022 | |
| 10 | 70/30 | 550° | — | 0.67 | 1.33 | 3 | 0.34 | 4.85610 | 13.24587 | 2.7277 | 1.9 |
| 11 | 70/30 | 550° | — | 0.67 | 1.33 | 2.95 | 0.34 | 4.84804 | 13.23103 | 2.7292 | 2.5 |
| 12 | 70/30 | 550° | — | 0.67 | 1.33 | 2.85 | 0.34 | 4.83993 | 13.24192 | 2.7360 | 2.5 |
| 13 | 50/50 | 500° | — | 1.01 | 0.99 | 2.80 | 0.51 | 4.89218 | 13.32858 | 2.7245 | 4.1 |
| 14 | 50/50 | 550° | — | 1.04 | 0.96 | 2.95 | 0.52 | 4.88403 | 13.31746 | 2.7267 | 1.9 |
| 15 | 50/50 | 600° | — | 1.06 | 0.94 | 2.95 | 0.53 | 4.87996 | 13.33965 | 2.7336 | 3.5 |
| 16 | 25/75 | 600° | — | 1.52 | 0.48 | 2.85 | 0.76 | 4.92028 | 13.44988 | 2.7336 | |
| 17 | 25/75 | 500° | — | 1.54 | 0.46 | 2.8 | 0.77 | 4.92464 | 13.43581 | 2.7283 | 4.5 |
| 18 | 25/75 | 550° | — | 1.53 | 0.47 | 2.8 | 0.77 | 4.92053 | 13.44655 | 2.7327 | 3.1 |
| 19 | 0/100 | 550° | — | 2.00 | 0.00 | 2.80 | 1.00 | 4.95876 | 13.58287 | 2.7392 | |
| 21 | 0/100 | 450° | — | 2.00 | 0.00 | 2.85 | 1.00 | 4.97116 | 13.58280 | 2.7323 | 2.0 |
| 22 | 0/100 | 500° | — | 2.00 | 0.00 | 2.75 | 1.00 | 4.97116 | 13.59412 | 2.7346 | 1.7 |
| DB3 - $Cr_2O_3$ | | | | 2.00 | 0.00 | 3.00 | 1.00 | 4.95876 | 13.59420 | 2.7415 | |

TABLE 2

| V-No. | Target [Al/Cr] | Depos'n Temp [° C.] | Glow Temp. [° C.] | | | | | Lattice Constants | | |
|---|---|---|---|---|---|---|---|---|---|---|
| | | | | | | | | a | c | c/a |
| 2 | 70/30 | 550° | RT | — | — | — | — | 4.85030 | 13.24484 | 2.7307 |
| 2 | 70/30 | 550° | 1000° | — | — | — | — | 4.85339 | 13.22837 | 2.7256 |
| 2 | 70/30 | 550° | 1100° | — | — | — | — | 4.84727 | 13.20028 | 2.7232 |

Test Objects: Hard Metal

TABLE 3

| | Intermediate Layer | | | | Mixed-Crystal Layer Monolayer Corundum Structure | |
|---|---|---|---|---|---|---|
| | Bonding Layer | | Hard Metal Layer | | | |
| V-No. | [(Me1Me2)X] | d [μm] | [(Me1Me2)X] | d [μm] | [(Me1Me2)X] | d [μm] |
| | TiN | | TiAlN | | $(Al_{.5}Cr_{.5})_2O_3$ | |
| | wo | | TiAlN | | $(Al_{.5}Cr_{.5})_2O_3$ | |
| | TiN | | TiAlN | | $(Al_{.5}Cr_{.5})_2O_3$ | |
| | TiN | | TiCN | | $(Al_{.65}Cr_{.35})_2O_3$ | |
| | TiN | | | | $(Al_{.65}Cr_{.35})_2O_3$ | |
| | | | TiCN | | $(Al_{.7}Cr_{.3})_2O_3$ | |
| | TiN | | TiAlN | | $(Al_{.7}Cr_{.3})_2O_3$ | |
| | TiN | | TiC | | $(Al_{.7}Cr_{.3})_2O_3$ | |
| | TiN | | TiAlN | | $(Al_{.7}Fe_{.3})_2O_3$ | |
| | TiN | | | | $(Al_{.6}Fe_{.4})_2O_3$ | |
| | TiN | | TiCN | | $(Al_{.6}Fe_{.4})_2O_3$ | |
| | | | TiCN | | $(Al_{.1}Fe_{.9})_2O_3$ | |
| | wo | | TiAlN | | $(Al_{.1}Fe_{.9})_2O_3$ | |
| | wo | | wo | | $(Al_{.5}Fe_{.5})_2O_3$ | |
| | wo | | wo | | $(Al_{.5}Fe_{.5})_2O_3$ | |
| | TiN | | wo | | $(Al_{.5}V_{.5})_2O_3$ | |
| | VN | | VCN | | $(Al_{.5}V_{.5})_2O_3$ | |
| | VN | | | | $(Al_{.5}V_{.5})_2O_3$ | |
| | CrN | | CrC | | $Cr_2O_3$ | |
| | CrN | | CrCN | | $Cr_2O_3$ | |
| | CrN | | wo | | $Cr_2O_3$ | |
| | CrN | | wo | | $Cr_2O_3$ | |
| | AlCrN | | wo | | $(Al_{.2}Cr_{.8})_2O_3$ | |

TABLE 3-continued

| V-No. | Mixed-Crystal Layer Monolayer Other Oxide Layer [(Me1Me2)X] | d [µm] | Cover Layer DS1 [(Me1Me2)X] | d [µm] | DS2 [(Me1Me2)X] | d [µm] |
|---|---|---|---|---|---|---|
|  | wo |  | wo |  | Wo |  |
|  | wo |  | wo |  | Wo |  |
|  | $(Al_{.7}Cr_{.3})_2O_3$ |  |  |  |  |  |
|  | $(Al,CR,Zr)_2O_{3+x}$ |  | $ZrO_2$ |  | ZrN |  |
|  | $(Al,Cr)_2O_3$ |  | AlCrN |  |  |  |
|  |  |  | AlCrN |  |  |  |
|  |  |  | AlCrN |  | TiN |  |
|  |  |  | AlVN |  |  |  |
|  |  |  | AlVN |  |  |  |
|  |  |  | CrN |  |  |  |
|  |  |  | CrN |  |  |  |
|  |  |  | CrN |  |  |  |
|  |  |  | AlCrN |  |  |  |

TABLE 4

| | Intermediate Layer | | | | Mixed-Crystal Layer Monolayer | | | | Cover Layer | | | |
|---|---|---|---|---|---|---|---|---|---|---|---|---|
| | Bonding Layer | | Hard Metal Layer | | Corundum Structure | | Other Oxide Layer | | DS1 | | DS2 | |
| V-No. | [(Me1Me2)X] | d [µm] | [(Me1Me2)X] | d [µm] | [(Me1Me2)X] | d [µm] | [(Me1Me2)X] | d [µm] | [(Me1Me2)X] | d [µm] | [(Me1Me2)X] | d [µm] |
| 46 | CrN | 0.3 | AlCrON | 5.0 | $(Al_{.02}Cr_{.08})_2O_3$ | 3.0 |  |  |  |  |  |  |
| 47 | CrN | 0.5 | AlCrN | 3.0 | $(Al_{.05}Cr_{.85})_2O_3$ | 3.0 | | | $(Al_{.7}Cr_{.3})_2O_3$ | 1.0 | CrN | 2.0 |
| 48 | AlCrN | 0.5 | AlCrON | 5.0 | $(Al_{.05}Cr_{.85})_2O_3$ | 3.0 |  |  |  |  |  |  |
| 49 | TiN | 0.8 | TiAlN | 4.0 | $(Al_{.5}Ti_{.5})_2O_3$ | 4.0 | | | TiN | 1.0 | | |
| 50 | wo |  | TiAlN | 6.0 | $(Al_{.5}Ti_{.5})_2O_3$ | 2.0 |  |  |  |  |  |  |
| 51 | TiN | 0.3 | TiCN | 8.0 | $(Al_{.7}Ti_{.3})_2O_3$ | 4.0 |  |  |  |  |  |  |
| 52 | wo |  | TiAlN | 3.0 | $(Al,Mg,Ti)_2O_3$ | 3.0 |  |  |  |  |  |  |
| 53 | TiN | 0.5 | AlMgTiN | 6.0 | $(Al,Mg,Ti)_2O_3$ | 4.0 |  |  |  |  |  |  |
| 54 | TiN | 6.0 |  |  | $(Al,Mg,Ti)_2O_3$ | 3.0 | | | TiN | 2.0 | | |
| 55 | TiN | 0.3 | (Al,Mg,Ti)ON | 5.0 | $(Al,Mg,Ti)_2O_3$ | 2.0 |  |  |  |  |  |  |
| 56 | AlCrN | 0.2 | (Al,Mg,Ti)ON | 1.0 | $(Al,Mg,Ti)_2O_3$ | 6.0 |  |  |  |  |  |  |
| 57 | TiN | 1.0 |  |  | $(Al,Fe,Ti)_2O_3$ | 5.0 | | | TiN | 0.5 | | |
| 58 | TiN | 1.0 | TiCN | 6.0 | $(Al,Fe,Ti)_2O_3$ | 2.0 | | | TiN | 1.0 | | |
| 59 | TiN | 1.0 | TiAlN | 4.0 | $(Al,Fe,Ti)_2O_3$ | 4.0 |  |  |  |  |  |  |
| 60 |  |  | TiCN | 4.0 | $(Al,Fe,Ti)_2O_3$ | 2.0 |  |  |  |  |  |  |

TABLE 5

| | Intermediate Layer | | | | Mixed-Crystal Layer as Multilayer | | | |
|---|---|---|---|---|---|---|---|---|
| | Bonding Layer | | Hard Metal Layer | | Corundum Structure | | Other ML Layer | |
| V-No. | [(Me1Me2)X] | d [µm] | [(Me1Me2)X] | d [µm] | [(Me1Me2)X] | d [µm] | [(Me1Me2)X] | d [µm] |
| 61 | TiN | 0.2 | TiAlN | 3.0 | $(Al_{.65}Cr_{.35})_2O_3$ | 0.100 | AlCrN | 0.100 |
| 62 | wo |  | TiAlN | 2.0 | $(Al_{.65}Cr_{.35})_2O_3$ | 0.500 | AlCrN | 0.500 |
| 63 | TiN | 0.3 | TiAlN | 3.0 | $(Al_{.65}Cr_{.55})_2O_3$ | 0.100 | AlCrN | 0.050 |
| 64 | TiN | 0.3 | TiAlN | 4.0 | $(Al_{.65}Cr_{.55})_2O_3$ | 0.050 | AlCrN | 0.050 |
| 65 | TiN | 0.3 | TiAlN | 3.0 | $(Al_{.65}Cr_{.35})_2O_3$ | 0.100 | $ZrO_2$ | 0.300 |
| 66 | TiN | 0.3 | TiAlN | 6.0 | $(Al_{.65}Cr_{.35})_2O_3$ | 0.200 | $Ta_2O_5$ | 0.100 |
| 67 | TiN | 0.3 | TiAlN | 3.0 | $(Al_{.65}Cr_{.35})_2O_3$ | 0.200 | $Nb_2O_5$ | 0.500 |
| 68 | TiN | 0.3 | TiAlN | 4.0 | $(Al_{.65}Cr_{.35})_2O_3$ | 0.200 | $V_2O_3$ | 0.100 |
| 69 | TiN | 0.3 | TiAlN | 3.0 | $(Al_{.65}Cr_{.35})_2O_3$ | 0.200 | $Al_{.8}Cr_{.2})_2O_3$ | 0.050 |
| 70 | TiN | 0.3 | TiAlN | 2.0 | $(Al_{.65}Cr_{.35})_2O_3$ | 0.200 | $(Al,V)_2O_3$ | 0.050 |
| 71 | TiN | 0.3 | TiAlN | 2.0 | $(Al_{.5}Cr_{.5})_2O_3$ | 0.100 | TiAlN | 0.100 |
| 72 | TiN | 0.2 | TiCN | 6.0 | $(Al_{.5}Cr_{.5})_2O_3$ | 0.100 | 0.100 | 0.100 |
| 73 | wo |  | TiCN | 3.0 | $(Al_{.5}Cr_{.6})_2O_3$ | 0.500 | AlCrN | 0.500 |
| 74 | TiN | 0.3 | TiCN | 12.0 | $(Al_{.5}Cr_{.5})_2O_3$ | 0.100 | AlCrN | 0.050 |
| 75 | TiN | 0.3 | TiCN | 8.0 | $(Al_{.5}Cr_{.5})_2O_3$ | 0.050 | AlCrN | 0.050 |

TABLE 5-continued

| | | | | | | | | |
|---|---|---|---|---|---|---|---|---|
| 76 | TiN | 0.3 | TiCN | 4.0 | (Al.5Cr.5)2O3 | 0.100 | ZrO2 | 0.300 |
| 77 | TiN | 0.3 | TiCN | 3.0 | (Al.5Cr.5)2O3 | 0.200 | Ta2O5 | 0.100 |
| 78 | TiN | 0.3 | TiCN | 6.0 | (Al.4Cr.0)2O3 | 0.200 | Nb2O5 | 0.500 |
| 79 | TiN | 0.3 | TiCN | 3.0 | (Al.4Cr.6)2O3 | 0.200 | V2O3 | 0.100 |
| 80 | TiN | 0.3 | TiCN | 2.0 | (Al.4Cr.6)2O3 | 0.200 | (Al,Cr)2O3 | 0.050 |
| 81 | TiN | 0.3 | TiCN | 3.0 | (Al.4Cr.6)2O3 | 0.200 | (Al,Zr)2O3 | 0.050 |
| 82 | TiN | 0.3 | TiC | 4.0 | (Al.4Cr.6)2O3 | 0.100 | AlCrN | 0.050 |
| 83 | TiN | 0.5 | TiAlN | 3.0 | (Al.4Cr.6)2O3 | 0.300 | (Al,Cr,Zr)2O3+> | 0.300 |
| 84 | TiN | 0.4 | TiAlN | 2.0 | (Al.7Cr.3)2O3 | 0.200 | (Al,Cr)2O3 | 0.200 |
| 85 | TiN | 0.3 | wo | | (Al.6V.4)2O3 | 0.200 | AlVN | 0.100 |
| 86 | VN | 0.4 | VCN | 4.0 | (Al.6V.4)2O3 | 0.200 | (Al,Cr)2O3 | 0.100 |

| | | Cover Layer | | | |
|---|---|---|---|---|---|
| | | DS1 | | | |
| V-No. | No. MLs | [(Me1Me2)X] | d [μm] | DS2 [(Me1Me2)X] | d [μm] |
| 61 | 50.0 | AlCrN | 0.5 | | |
| 62 | 10.0 | | | | |
| 63 | 100.0 | AlCrN | 0.2 | | |
| 64 | 100.0 | | | | |
| 65 | 10.0 | ZrN | 1.0 | | |
| 66 | 30.0 | TaN | 0.6 | | |
| 67 | 10.0 | NbN | 1.0 | | |
| 68 | 50.0 | | | | |
| 69 | 30.0 | AlCrN | 0.2 | | |
| 70 | 30.0 | AlVN | 0.2 | | |
| 71 | 50.0 | | | | |
| 72 | 50.0 | AlCrN | 0.5 | | |
| 73 | 10.0 | | | | |
| 74 | 100.0 | AlCrN | 0.2 | | |
| 75 | 100.0 | | | | |
| 76 | 10.0 | ZrN | 1.0 | | |
| 77 | 30.0 | TaN | 0.5 | | |
| 78 | 10.0 | NbN | 1.0 | | |
| 79 | 50.0 | | | | |
| 80 | 30.0 | AlCrN | 0.2 | | |
| 81 | 30.0 | AlZrN | 0.2 | | |
| 82 | 100.0 | TiN | 0.2 | | |
| 83 | | ZrN | 1.0 | ZrN | 0.5 |
| 84 | 10.0 | AlCrN | 0.5 | | |
| 85 | | | | TiN | 0.3 |
| 86 | | | | | |

TABLE 6

| | Intermediate Layer | | | | Mixed-Crystal Layer as Multilayer | | | |
|---|---|---|---|---|---|---|---|---|
| | Bonding Layer | | Hard Metal Layer | | Corundum Structure | | Other ML Layer | |
| V-No. | [(Me1Me2)X] | d [μm] | [(Me1Me2)X] | d [μm] | [(Me1Me2)X] | d [μm] | [(Me1Me2)X] | d [μm] |
| 87 | CrN | 0.5 | CrC | 4.0 | Cr2O3 | 0.200 | CrN | 0.300 |
| 88 | CrN | 0.5 | CrCN | 6.0 | Cr2O3 | 0.200 | (Al.65Cr.35)2O3 | 0.100 |
| 89 | CrN | 0.5 | wo | | Cr2O3 | 1.000 | (Al.65Cr.35)2O3 | 0.500 |
| 90 | CrN | 0.5 | wo | | Cr2O3 | 0.050 | (Al.65Cr.35)2O3 | 0.050 |
| 91 | CrN | 0.5 | wo | | Cr2O3 | 0.050 | CrN | 0.050 |
| 92 | AlCrN | 0.3 | wo | | (Al.65Cr.35)2O3 | 0.100 | CrN | 0.400 |
| 93 | CrN | 0.3 | AlCrON | 5.0 | (Al.5Cr.5)2O3 | 0.200 | (Al.7Cr.3)2O3 | 0.100 |
| 94 | CrN | 0.5 | AlCrN | 3.0 | (Al.5Cr.5)2O3 | 1.000 | (Al.7Cr.3)2O3 | 0.500 |
| 95 | AlCrN | 0.5 | AlCrON | 5.0 | (Al.5Cr.5)2O3 | 0.050 | (Al.7Cr.3)2O3 | 0.050 |
| 96 | TiN | 0.8 | TiAlN | 4.0 | (Al.5Ti.5)2O3 | 0.100 | TiAlN | 0.200 |
| 97 | wo | | TiAlN | 6.0 | (Al.1Ti.0)2O3 | 0.050 | TiAlN | 0.300 |
| 98 | TiN | 0.3 | TiCN | 8.0 | (Al.1Ti.0)2O3 | 0.200 | (Al.7Cr.3)2O3 | 0.100 |
| 99 | wo | | TiAlN | 3.0 | (Al,Mg,Ti)2O3 | 0.100 | 0.100 | 0.100 |
| 100 | TiN | 0.5 | AlMgTiN | 6.0 | (Al,Mg,Ti)2O3 | 0.500 | AlCrN | 0.500 |
| 101 | TiN | 5.0 | | | (Al,Mg,Ti)2O3 | 0.100 | AlCrN | 0.050 |
| 102 | TiN | 0.3 | (Al,Mg,Ti)ON | 5.0 | (Al,Mg,Ti)2O3 | 0.050 | AlCrN | 0.050 |
| 103 | AlCrN | 0.2 | (Al,Mg,Ti)ON | 1.0 | (Al,Mg,Ti)2O3 | 0.100 | (Al.65Cr.35)2O3 | 0.300 |
| 104 | TiN | 1.0 | | | (Al,Fe,Ti)2O3 | 0.200 | Nb2O3 | 0.500 |
| 105 | TiN | 1.0 | TiCN | 6.0 | (Al,Fe,Ti)2O3 | 0.200 | V2O3 | 0.100 |

TABLE 6-continued

| | | | | | | | | |
|---|---|---|---|---|---|---|---|---|
| 106 | TiN | 1.0 | TiAlN | 4.0 | (Al,Fe,Ti)$_2$O$_3$ | 0.200 | (Al$_{.65}$Cr$_{.35}$)$_2$O$_3$ | 0.100 |
| 107 | TiN | | TiCN | 4.0 | (Al,Fe,Ti)$_2$O$_3$ | 0.200 | (Al,Me)$_2$O$_3$ | 0.050 |

| | | Cover Layer | | | |
|---|---|---|---|---|---|
| | | DS1 | | DS2 | |
| V-No. | No. MLs | [(Me1Me2)X] | d [µm] | [(Me1Me2)X] | d [µm] |
| 87 | 5.0 | CrN | 2.0 | | |
| 88 | 10.0 | CrN | 1.0 | | |
| 89 | 5.0 | | | | |
| 90 | 200.0 | | | | |
| 91 | 100.0 | | | | |
| 92 | 8.0 | AlCrN | 1.0 | | |
| 93 | 10.0 | | | | |
| 94 | 5.0 | CrN | 0.5 | CrN | 2.0 |
| 95 | 200.0 | | | | |
| 96 | 30.0 | TiN | 1.0 | | |
| 97 | 10.0 | | | | |
| 98 | 20.0 | | | | |
| 99 | 40.0 | | | | |
| 100 | 12.0 | | | | |
| 101 | 50.0 | | | | |
| 102 | 30.0 | | | | |
| 103 | 15.0 | | | | |
| 104 | 20.0 | TiN | 0.5 | | |
| 105 | 20.0 | TiN | 0.5 | | |
| 106 | 10.0 | | | | |
| 107 | 15.0 | | | | |

TABLE 7

| Material | I-Source 1 [A] | I-S.2 [A] | I-S.3 [A] | I-S.4 [A] | U-base-bp [V] | O2 [sccm] | N2 [sccm] | p [Pa] | T [° C.] |
|---|---|---|---|---|---|---|---|---|---|
| AlCrO | — | 200 | — | 200 | −60 | 1000 | — | 2.6 | 550° C. |
| AlCrO—AlCrN Multilayer | — | 200 | — | 200 | −60 | 1000 | 1000 | 2.6 | 550° C. |

Coil current of the source magnetic system 0.5 to 1 A

TABLE 8

| Material | I-Source 1 [A] | I-S.2 [A] | I-S.3 [A] | I-S.4 [A] | U-Bias DC [V] | Ar [sccm] | C2H2 [sccm] | N2 [sccm] | p [Pa] | T [° C.] |
|---|---|---|---|---|---|---|---|---|---|---|
| TiAlN | 200 | — | 200 | — | −40 | | — | Pressure regulated | 3 | 550° C. |
| TiN | 180 | — | 180 | — | −100 | | — | Pressure regulated | 0.8 | 550° C. |
| TiCN | 190 | — | 190 | — | −100 | 420 | 15-125 | 500-150 | 2.5-2.0 | 550° C. |
| AlCrN | 200 | — | 200 | — | −100 | — | — | 1000 | 2.6 | 550° C. |
| AlMeN | 140 | — | 140 | — | −80 | — | — | 600 | 0.8 | 500° C. |
| AlMeCN | 220 | — | 220 | — | −120 | 300 | 10-150 | Pressure regulated | 2.5 | 600° C. |

Coil current of the source magnetic system 0.1 to 2 A

The invention claimed is:

1. Arc evaporation deposited PVD layer system for the coating of workpieces, encompassing at least one mixed-crystal layer of a multi-oxide of the following composition:

(Me1$_{1-x}$Me2$_x$)$_2$O$_3$ where Me1 and Me2 each represent at least one of the elements Al, Cr, Fe, Li, Mg, Mn, Nb, Ti, Sb or V and the elements of Me1 and Me2 differ from one another, wherein 1-x and x represent a stoichiometry of the Me1 Me2 alloy, characterized in that the crystal lattice of the mixed-crystal layer exhibits a corundum structure which in a spectrum analyzed by x-ray diffractometry is characterized by at least three of the lines associated with the corundum structure, wherein said mixed-crystal layer a multi-oxide comprises areas of said at least one element.

2. Layer system as in claim 1, characterized in that the corundum structure of the mixed-crystal layer is so thermally stable that even after 30 minutes of heating in air at a temperature of at least 1000° C. or at least 1100° C. the lattice parameter(s) a and/or c of the mixed-crystal layer will not shift by more than a maximum of 2%.

3. Layer system as in claim 2, characterized in that the lattice parameter(s) a and/or c of the mixed-crystal layer will not shift by more than a maximum of 1%.

4. Layer system as in one of the preceding claims, characterized in that the mixed-crystal layer has a stoichiometric or substoichiometric oxygen content.

5. Layer system as in claim 4, characterized in that the oxygen content remains 0 to 15 percentage points below the stoichiometric composition of the compound.

6. Layer system as in claim 5, characterized in that the oxygen content remains 0 to 10 percentage points below the stoichiometric composition of the compound.

7. Layer system as in claim 1, characterized in that the mixed-crystal layer is finely crystalline with an average crystallite size of less than 0.2 µm.

8. Layer system as in claim 7, characterized in that the mixed-crystal layer is finely crystalline with an average crystallite size of less than 0.1 µm.

9. Layer system as in claim 1, characterized in that Me1 is comprised of Al and Me2 of at least one of the elements Cr, Fe, Li, Mg, Mn, Nb, Ti, Sb or V and is $0.2 \leq x \leq 0.98$.

10. Layer system as in claim 9 characterized in that Me1 is comprised of Al and Me2 of at least one of the elements Cr, Fe, Li, Mg, Mn, Nb, Ti, Sb or V and is $0.3 \leq x \leq 0.95$.

11. Layer system as in claim 1, characterized in that the content of inert gas and halogens in the mixed-crystal layer is less than 2 at % each.

12. Layer system as in claim 11, characterized in that the inert gas content in the mixed-crystal layer does not exceed a maximum of 0.1 at % and/or the halogen content does not exceed a maximum of 0.5 at %.

13. Layer system as in claim 12, characterized in that the inert gas content in the mixed-crystal layer does not exceed a maximum of 0.05 at %.

14. Layer system as in claim 12, characterized in that the halogen content does not exceed a maximum of 0.1 at %.

15. Layer system as in claim 12, characterized in that the mixed-crystal layer contains essentially no inert gas and/or halogen.

16. Layer system as in claim 1, characterized in that the layer stress of the mixed-crystal layer is so minor that the deviation of the lattice parameters of the multi-oxides from the value determined by Vegard's Law is less than or equal to 1%.

17. Layer system as in claim 16, characterized in that the deviation of the lattice parameters of the multi-oxides from the value determined by Vegard's Law is less than or equal to 0.8%.

18. Layer system as in claim 1, characterized in that
the layer stress measured on a mixed-crystal layer 2 µm thick represents a compressive or tensile stress with a value of less than ±0.8 GPa.

19. Layer system as in claim 18, characterized in that the layer stress measured on a mixed-crystal layer 2 µm thick represents a compressive or tensile stress with a value of less than ±0.5 GPa.

20. Layer system as in claim 1, characterized in that the mixed-crystal layer encompasses a multi-stratum layer consisting of at least two different, alternatingly deposited multi-oxides.

21. Layer system as in claim 1, characterized in that the mixed-crystal layer encompasses a multistratum layer consisting of at least one multi-oxide and an additional oxide in an alternating sequence.

22. Layer system as in claim 1, characterized in that the multi-oxide is a double oxide.

23. Layer system as in claim 22, characterized in that the additional oxide is $HfO_2$, $Ta_2O_5$, $TiO_2$, $ZrO_2$, $\gamma\text{-}Al_2O_3$.

24. Layer system as in claim 22, characterized in that the multi-oxide is $(AlCr)_2O_3$ or $(AlV)_2O_3$.

25. Layer system as in claim 23, characterized in that the additional oxide is an oxide having a corundum structure.

26. Layer system as in claim 25, characterized in that the oxide having a corundum structure is $Cr_2O_3$, $V_2O_3$, $Fe_2O_3$, $FeTiO_3$, $MgTiO_2$ or $\alpha\text{-}Al_2O_3$.

27. Layer system as in claim 1, characterized in that in addition to the mixed-crystal layer at least one intermediate layer is positioned between the workpiece and the mixed-crystal layer and/or a cover layer is deposited on the mixed-crystal layer, and
that these contain one of the metals of sub-groups IV, V and VI of the periodic system and/or Al, Si, Fe, Ni, Co, Y, La or a mixture thereof.

28. Layer system as in claim 27, characterized in that the at least one intermediate layer is a bonding layer and/or a hard-metal layer.

29. Layer system as in claim 27, characterized in that the metals of the hard-metal layer and/or the cover layer are compounds with N, C, O, B or mixtures thereof.

30. Layer system as in claim 29, characterized in that the metals of the hard-metal layer and/or the cover layer are compounds with N or CN.

31. Layer system as in claim 27 or 29, characterized in that the hard-metal layer comprises TiN, TiCN, AlTiN, AlTiCN, AlCrN or AlCrCN and
the cover layer comprises AlCrN, AlCrCN, $Cr_2O_3$ or $Al_2O_3$.

32. Layer system as in claim 31, characterized in that the cover layer comprises $\gamma\text{-}Al_2O_3$ or $\alpha\text{-}Al_2O_3$.

33. Layer system as in claim 27, characterized in that the intermediate layer and/or the hard-metal layer includes a multi-stratum layer.

34. Layer system as in claim 27, characterized in that the intermediate layer and the mixed-crystal layer and/or the cover layer and the mixed-crystal layer are disposed in the form of an alternating multi-stratum layer.

35. Layer system as in claim 27, characterized in that the layer system has an overall layer thickness of more than 10 µm.

36. Layer system as in claim 35, characterized in that the layer system has an overall layer thickness of more than 20 µm.

37. Layer system as in claim 27, characterized in that the mixed-crystal layer has a thickness of more than 5 µm.

38. Layer system as in claim 37, characterized in that the mixed-crystal layer has a thickness of more than 8 µm.

39. A tool or component for use at high temperatures and/or subject to strong chemical exposure, characterized in that it is coated with a layer system described in claim 1.

40. A tool or component as in claim 39, characterized in that at least in the areas exposed to wear the base material of the tool consists of tool steel, HSS high-speed steel, a PM steel or an HM, cermet or CBN sintered metal and that at least in the areas exposed to wear the base material of the component consists of a cold-working steel, HSS high-speed steel, a PM steel or an HM, cermet, SiC, SiN or CBN sintered metal or of polycrystalline diamond.

41. Tool as in claim 39, characterized in that it is a cutting tool, especially an interchangeable cutting insert consisting of HSS, HM, cermet, CBN, SiN, SiC or a PM steel or that it is a diamond-coated interchangeable insert.

42. Tool as in claim 39, characterized in that it is a non-cutting shaping tool, in particular a forging tool.

43. Tool as in claim 39, characterized in that it is a die-casting tool.

44. Component as in claim 39, characterized in that the component is a part of a combustion engine, in particular a fuel injection nozzle, a piston ring, a tappet, or a turbine blade.

45. Layer system as in claim 1, characterized in that the crystal lattice of the mixed-crystal layer exhibits a corundum structure which in a spectrum analyzed by x-ray diffractometry is characterized by four of the lines associated with the corundum structure.

46. Layer system as in claim 1, characterized in that the crystal lattice of the mixed-crystal layer exhibits a corundum structure which in a spectrum analyzed by x-ray diffractometry is characterized by five of the lines associated with the corundum structure.

* * * * *

UNITED STATES PATENT AND TRADEMARK OFFICE
CERTIFICATE OF CORRECTION

PATENT NO. : 7,939,181 B2
APPLICATION NO. : 11/548529
DATED : May 10, 2011
INVENTOR(S) : Jürgen Ramm et al.

It is certified that error appears in the above-identified patent and that said Letters Patent is hereby corrected as shown below:

In the specification, column 4, lines 25-30, replace the current incorrect formula:

$$\sigma = \frac{E_s * D_s^2}{3 * L^2 * d_j} * f$$

with the following correct formula:

$$\sigma = \frac{E_s * D_s^2}{3 * L^2 * d_f} * f$$

In the specification, column 12, line 49, replace "am" with -- μm --

Signed and Sealed this
Nineteenth Day of July, 2011

David J. Kappos
*Director of the United States Patent and Trademark Office*